(12) United States Patent
Stedman et al.

(10) Patent No.: US 9,021,164 B2
(45) Date of Patent: Apr. 28, 2015

(54) NEAR FIELD COMMUNICATION MIMIC DEVICE AND METHOD OF USE

(75) Inventors: Roy Stedman, Austin, TX (US); Abu Sanaullah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 190 days.

(21) Appl. No.: 13/566,906

(22) Filed: Aug. 3, 2012

(65) Prior Publication Data

US 2014/0040509 A1    Feb. 6, 2014

(51) Int. Cl.
G06F 3/00 (2006.01)
G06F 13/12 (2006.01)
G06F 13/38 (2006.01)
H04B 5/00 (2006.01)
G06F 13/10 (2006.01)
G06F 1/16 (2006.01)

(52) U.S. Cl.
CPC .......... H04B 5/0031 (2013.01); G06F 13/105 (2013.01); H04B 5/0056 (2013.01); G06F 1/1632 (2013.01)

(58) Field of Classification Search
CPC .. H04B 5/0031; H04B 5/0056; G06F 1/1632; G06F 13/105

USPC ........................................ 710/8, 72
See application file for complete search history.

(56) References Cited

U.S. PATENT DOCUMENTS

| | | | |
|---|---|---|---|
| 2005/0027889 A1* | 2/2005 | Sandulescu | 709/250 |
| 2008/0132167 A1 | 6/2008 | Bent et al. | |
| 2010/0045441 A1* | 2/2010 | Hirsch et al. | 340/10.1 |
| 2010/0068997 A1* | 3/2010 | Dunko | 455/41.1 |
| 2011/0070829 A1* | 3/2011 | Griffin et al. | 455/41.1 |
| 2011/0143661 A1* | 6/2011 | Hartwig et al. | 455/41.1 |
| 2011/0199194 A1 | 8/2011 | Waldock et al. | |
| 2011/0275316 A1* | 11/2011 | Suumaki et al. | 455/41.1 |
| 2011/0320293 A1 | 12/2011 | Khan | |
| 2013/0005246 A1* | 1/2013 | Waters et al. | 455/41.1 |

* cited by examiner

*Primary Examiner* — Eric Oberly
(74) *Attorney, Agent, or Firm* — Terrile, Cannatti, Chambers & Holland, LLP; Robert W. Holland

(57) ABSTRACT

A NFC mimic device retrieves peripheral information from a peripheral, stores the peripheral information and then mimics the peripheral information to an information handling system so that a NFC device of the information handling system receives the peripheral information as if provided directly from the peripheral. The NFC mimic device supports automated setup a wireless interface between an information handling system and a peripheral, such as a projector.

18 Claims, 3 Drawing Sheets

NEAR FIELD COMMUNICATION MIMIC DEVICE AND METHOD OF USE

BACKGROUND OF THE INVENTION

1. Field of the Invention

The present invention relates in general to the field of near field communication, and more particularly to a near field communication mimic device and method of use.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems interact with a wide variety of peripherals to perform functions. Traditionally, information handling systems interfaced with peripherals through cables and communicated with the peripherals using customized driver software. Over time, many peripheral devices adopted standardized communication protocols and cables so that end users could more readily interact with peripheral devices. One example of a common peripheral device is a display, which presents visual information generated by an information handling system as images. Displays have progressed from analog interfaces, such as VGA cables, to digital interfaces that communicate over serial links, such as DVI and DisplayPort cables, and more recently to wireless interfaces that do not use cables at all. Projectors are essentially a type of display that typically interacts with information handling systems in the same manner as other displays. Other examples of peripheral devices that interact with information handling systems include printers, scanners, network devices, cameras, etc. . . . Many of these peripherals interface with information handling systems through standardized cables, such as USB cables, as well as through wireless interfaces, such as IEEE 802.11 (a-n) interfaces, Bluetooth interfaces or other similar "Wi-Fi" interfaces.

Often information handling systems automatically interact with peripheral devices by detecting that a cable has plugged into a port of the information handling system and responding with a handshake that initiates operation of the peripheral device. Wireless peripheral interfaces have improved the convenience of interacting with peripheral devices by removing the need for a cable to communicate between information handling systems and peripheral devices, however, the lack of an automated response provided through a cable can make establishing communication more difficult. In addition, wireless interfaces that are not secured by a key or other password may present security issues since the wireless signals may be intercepted by unauthorized users. One solution for establishing a secure wireless interface between an information handling system and a peripheral is to include a near field communication (NFC) device in the information handling system and peripheral to exchange interface information for establishing the wireless interface.

NFC generally relates to a set of standards initially developed for smartphones. The NFC forum defined standards to establish radio communication between smartphones by touching the smartphones together or bringing the smartphones in close proximity to each other, such as within a few centimeters of each other. NFC devices allow contact free transactions and data exchange between each other. One advantageous use of NFC devices is to provide a simplified setup of more complex communication channels, such as a Wi-Fi communication channel between an information handling system and a peripheral, such as a display, projector, printer, scanner, etc. . . . The NFC Forum standards cover communication protocols and data exchange formats based on existing radio-frequency identification (RFID) standards. NFC devices allow two-way communication between endpoints, although unpowered NFC "tags" can also be read by powered NFC devices. In a passive communication mode, an initiator device provides a carrier field that the target device answers by modulating the existing field. In the passive mode, if the target device is an unpowered tag, it may draw its operating power from the initiator-provided electromagnetic field. In an active communication mode, both the initiator and target devices communicate by alternatively generating their own fields, typically with each device having its own power source.

One difficulty with NFC devices is that information handling systems and peripherals sometimes have larger-sized housings that are difficult to bring into close proximity with each other. End users who seek to use embedded NFC devices to establish a Wi-Fi interface between an information handling system and peripheral sometimes have to hold one or both of the housings in awkward positions in order to obtain the proximity necessary for exchanging information. In addition, end users sometimes have to arrange peripherals in inconvenient positions in order to have access to NFC devices within the peripherals.

SUMMARY OF THE INVENTION

Therefore a need has arisen for a system and method which provides a pass-through of NFC information when NFC devices are not conveniently brought into proximity with each other.

In accordance with the present invention, a system and method are provided which substantially reduce the disadvantages and problems associated with previous methods and systems for communicating between NFC devices. A mimic device copies and repeats a NFC communication as an intermediary between a NFC initiator and target so that the initiator and target can exchange information without having to come into proximity with each other.

More specifically, a NFC mimic aids in configuring an information handling system and peripheral to communicate through a wireless interface. For example, the NFC mimic is a tag in a separate and mobile housing that receives and stores a NFC communication provided from a peripheral. The NFC mimic is then moved to a position proximate to an information handling system NFC device, which reads the NFC mimic as if the NFC mimic was the peripheral. For instance, the information handling system NFC device reads peripheral configuration information from the NFC mimic and applies the peripheral configuration information to initiate a Wi-Fi interface with the peripheral.

The present invention provides a number of important technical advantages. One example of an important technical advantage is that NFC devices embedded in information handling systems and peripherals are more convenient to use. An end user captures information from a first NFC device with a conveniently-sized mimicking device, stores the NFC information on the mimicking device and then moves the mimicking device to a position proximate a second NFC device. The second NFC device reads the information from the mimicking device as if the information was provided from the first NFC device. In this manner, an end user can have tap-to-connect usability for establishing a Wi-Fi interface between an information handling system and a peripheral even where the information handling system and peripheral are difficult to bring into proximity with each other.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
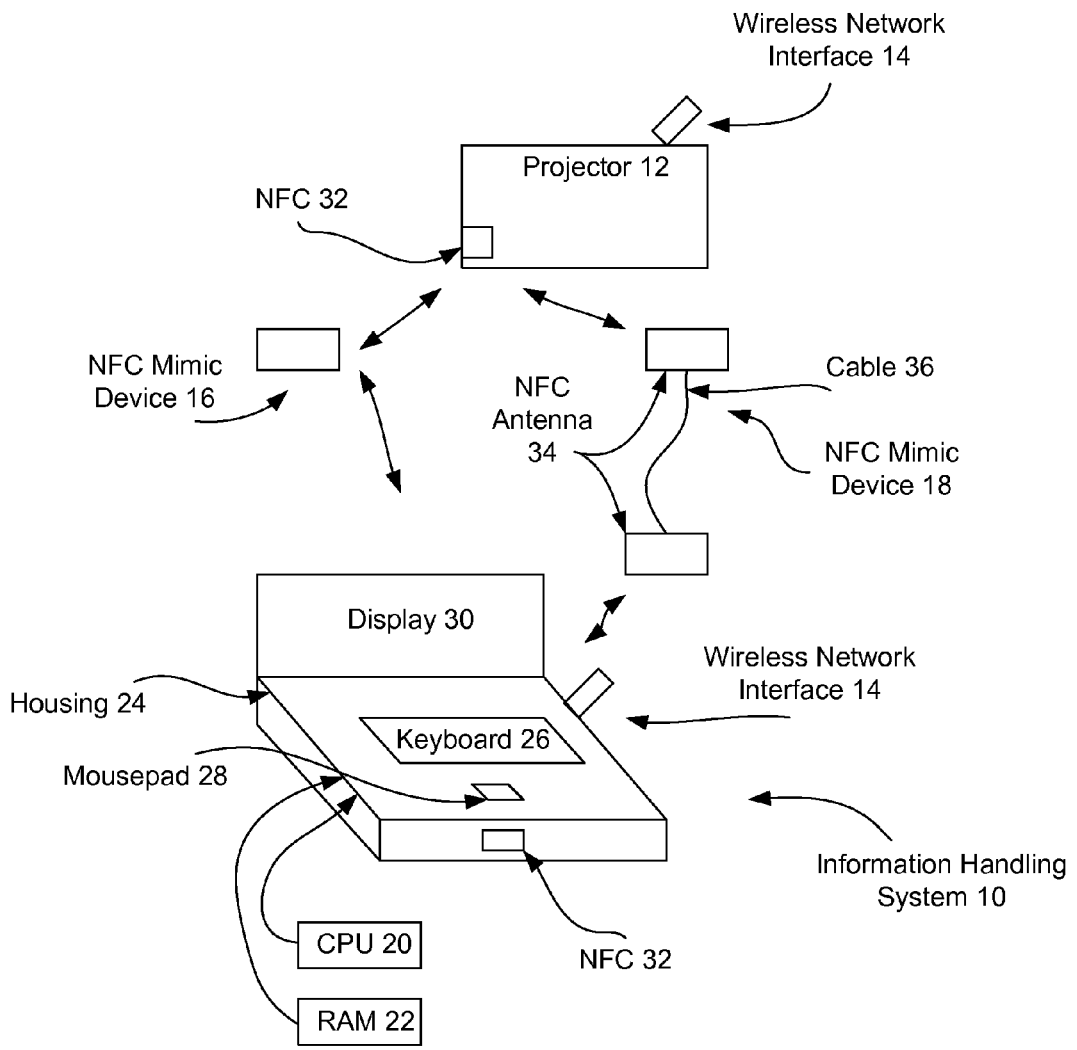
FIG. 1 depicts an example of an information handling system and projector peripheral having a wireless interface established by a NFC mimic device.

Referring now to FIG. 1, an example is depicted of an information handling system 10 and projector peripheral 12 having a wireless interface 14 established by a NFC mimic device 16 or 18. Information handling system 10 processes information with a central processing unit (CPU) 20 and memory 22 disposed in a housing 24. In the example embodiment, information handling system 10 is a portable information handling system that accepts inputs through an integrated keyboard 26 and mousepad 28 and presents information as images at an integrated display 30. Each of information handling system 10 and peripheral 12 has a NFC device 32 integrated within its housing. NFC devices 32 store configuration information that allow information handling system 10 and peripheral 12 to establish wireless interface 14, such TCP/IP address, MAC address, SSID key and other information. In alternative embodiments, alternative types of information handling systems 10 and peripherals 12 may exchange information by using NFC mimic devices 16 and 20.

In operation, an end user enters a conference room having projector 12 and desires to use projector 12 to present images from information handling system 10. To establish wireless interface 14, such as a wireless personal area network (WPAN), between information handling system 10 and projector 12, the end user can bring the NFC device 32 integrated in housing 24 into proximity with the NFC device 32 integrated in the housing of projector 12. When the two integrated NFC devices 32 are brought into proximity, peripheral configuration information is provided by a NFC communication from projector 12 to information handling system 10 so that wireless interface 14 is automatically established. However, instead of bringing information handling system 10 and projector 12 into proximity, the end user can use NFC mimic devices 16 and/or 18 to transfer the peripheral configuration information.

NFC mimic device 16 is a single-unit NFC device that acts as a store-and-reply intermediary for a non-interactive session with information handling system 10. Peripheral configuration information is read by NFC mimic device 16 from NFC device 32 of projector 12 and then stored locally within memory of NFC mimic device 16. For instance, information technology professionals responsible for the conference room make an input to a mimic initiator of mimic device 16 to cause mimic device 16 to store information read from the NFC device 32 of peripheral 12 in reprogrammable memory of mimic device 16. When an end user enters the conference room and desires to use projector 12, the end user brings mimic device 16 in proximity to NFC device 32 of information handling system 10 where mimic device 16 repeats stored information from peripheral 12 for the NFC device 32 to read as if in proximity to the NFC device 32 of peripheral 12. By emulating a NFC device 32 of projector 12, NFC mimic device 16 allows ceiling mounting of a wireless projector with connection information for establishing a wireless interface available on the table below within easy reach of an end user. NFC mimic device 16 is, for example, tapped once at the projector to acquire connection information and then placed on the conference table to be picked up and tapped by anyone who wishes to use the projector. In one embodiment, an interactive session between information handling system 10 and NFC mimic device 16 would allow exchange of security information for return to the projector, such as by again tapping the projector, so that a secure network interface 14 is established. In one embodiment, information technology professionals issue and re-issue NFC mimic devices 16 corresponding to connection information for a peripheral, even where the peripheral itself lacks a NFC device, so that end users with NFC-enabled information handling systems can establish wireless interface 14 automatically. In another embodiment, a unique security identifier tracks lost or stolen cards so that missing NFC cards are invalidated in a security database to prevent unauthorized use.

NFC device 18 is a double-unit "pipe" device that transfers information between two distal integrated NFC devices 32. Each end of NFC mimic device 18 has a NFC antenna 34 with a cable 36 interfacing the antennae 34. NFC mimic device 18 establishes an interactive session between two distal integrated NFC devices 32 by acting as a pass-through device to communicate peripheral information. Cable 36 communicates information between each NFC antenna 34 to allow NFC communications between information handling system 10 and peripheral 12 as if placed in physical proximity to each other. In a conference room setting, one end of NFC mimic device 18 couples to peripheral 12 for access by an end user. In other situations, an end user can carry a double-unit mimic device 18 for use in connecting information handling systems with each other without holding the information handling systems in proximity with each other.

Figure 2:
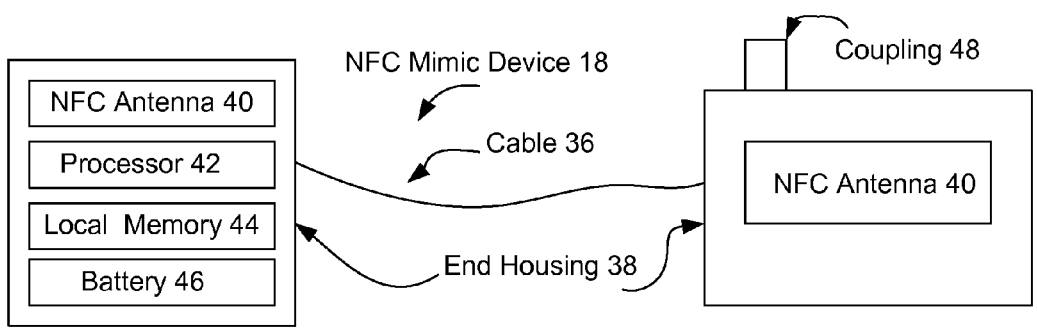
FIG. 2 depicts an example embodiment of a double unit mimic device having a cable interfacing NFC antennae at opposing ends.

Referring now to FIG. 2, an example embodiment of a double unit mimic device 18 is depicted having a cable 36 interfacing NFC antennae 40 at opposing ends. One end housing 38 holds a NFC antenna 40 interfaced with a processor 42 and local memory 44. A battery 46 supports operation of processor 42 and local memory 44 as a powered NFC device. The opposing end housing 38 holds a NFC antenna 40 interfaced with cable 36 to communicate electrical signals with the NFC antenna 40 in the opposing end housing 38. A coupling device 48 holds one end housing 38 at a peripheral device proximate a NFC device of the peripheral device. NFC antenna 40 coupled proximate to the peripheral acts as a NFC tag that obtains power from the peripheral NFC device and reads peripheral information. Power and peripheral information is sent through cable 36 to the opposing end where processor 44 programs the peripheral information in local memory 44 so that antenna 40 interfaced with local memory 44 outputs the peripheral information. In alternative embodiments, each NFC antenna 40 can act as a NFC tag that operates independent of power by harvesting power from an external NFC device initiator. Essentially, double unit mimic device 18 passes information from an external NFC initiator to a NFC target at an opposing end so that the target and initiator do not have to be brought into physical proximity with each other.

Figure 3:
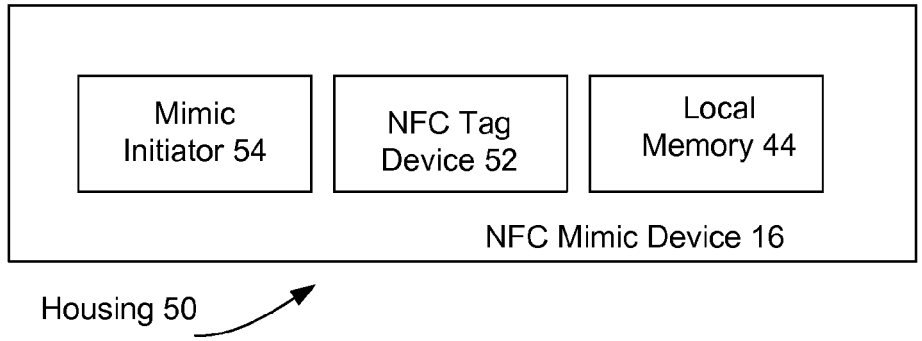
FIG. 3 depicts an example embodiment of a single-unit NFC mimic device.

Referring now to FIG. 3, an example embodiment is depicted of a single-unit NFC mimic device 16. A housing 50, such as a plastic card, holds a NFC tag device 52 with a local memory 44 and a mimic initiator 54. Mimic initiator 54 accepts an indication from an end user that an NFC communication received at NFC tag device 52 should be used to re-program local memory 44. For example, mimic initiator is a button pressed on housing 50 when placed next to a NFC device that an end user desires to mimic. The NFC device being mimicked (the initiator) provides power by its transmission to NFC tag device 52 so that local memory 44 is reprogrammed with information output by the initiator. When housing 50 is placed next to another NFC initiator and mimic initiator 54 is not activated, then NFC tag device 52 outputs the information from local memory 44. Mimic initiator sets a value at a pin of processor of NFC tag device 52 so that a NFC initiator is either copied for mimicking or responded to in a conventional manner based upon the pin value. In an alternative embodiment, mimic initiator 54 is an acceleration detector, such as an accelerometer or a reed switch, that sets a pin value for copying an initiator when an acceleration is detected. An end user taps housing 50 next to a NFC device that the end user wants to mimic and then holds the housing next to an NFC device that the end user wants to receive the mimicked signals. In an alternative embodiment, a powered NFC device is used in the place of the unpowered NFC tag device 52.

Figure 4:
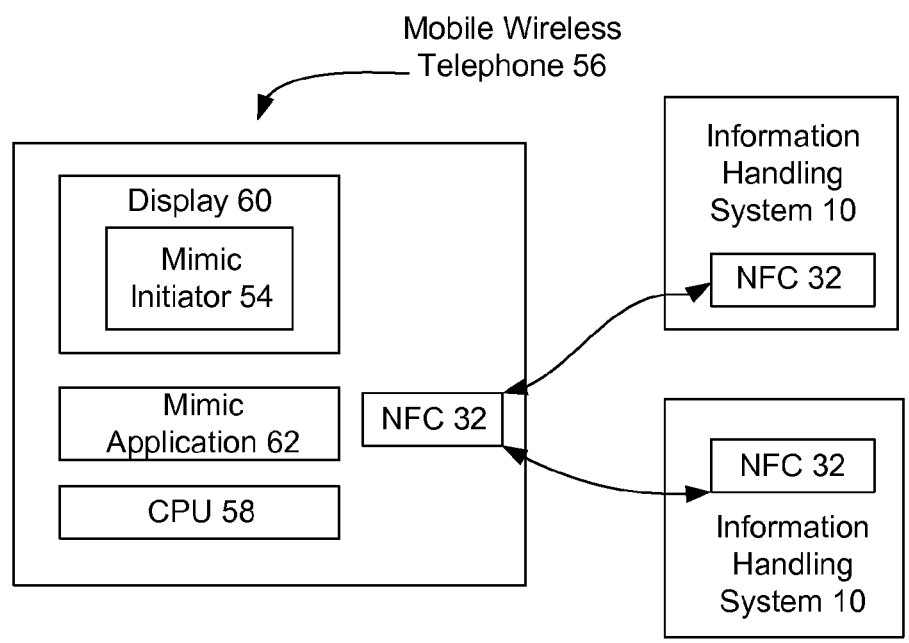
FIG. 4 depicts an embodiment of a wireless telephone providing a NFC mimic device.

Referring now to FIG. 4, an embodiment is depicted of a wireless telephone 56 providing a NFC mimic device 16. Wireless telephone 56 is, for example, a smartphone having wireless telephone and internet browsing capabilities through a wireless wide area network, such as is provided by a cellular phone provider. A CPU 58 of wireless telephone 56 runs applications, known as "apps", that perform functions presented at a display 60 integrated in wireless telephone 56. A NFC device 32 integrated in wireless telephone 56 operates in a conventional manner. A mimic application 62 running on CPU 58 of wireless telephone 56 presents a mimic initiator 54 at display 60. An end user who wants to establish communication between information handling systems 10 holds wireless telephone 56 proximate to a NFC device 32 of a first information handling system 10 and presses mimic initiator 54 to retrieve and store information output from the first information handling system 10. The end user then holds wireless telephone 56 proximate to the second information handling system 10 to transmit the NFC information stored from the first information handling system to the second information handling system. The end user can repeat the process to copy information from the second to the first information handling system, such as if security information is shared from each system.

Figure 5:
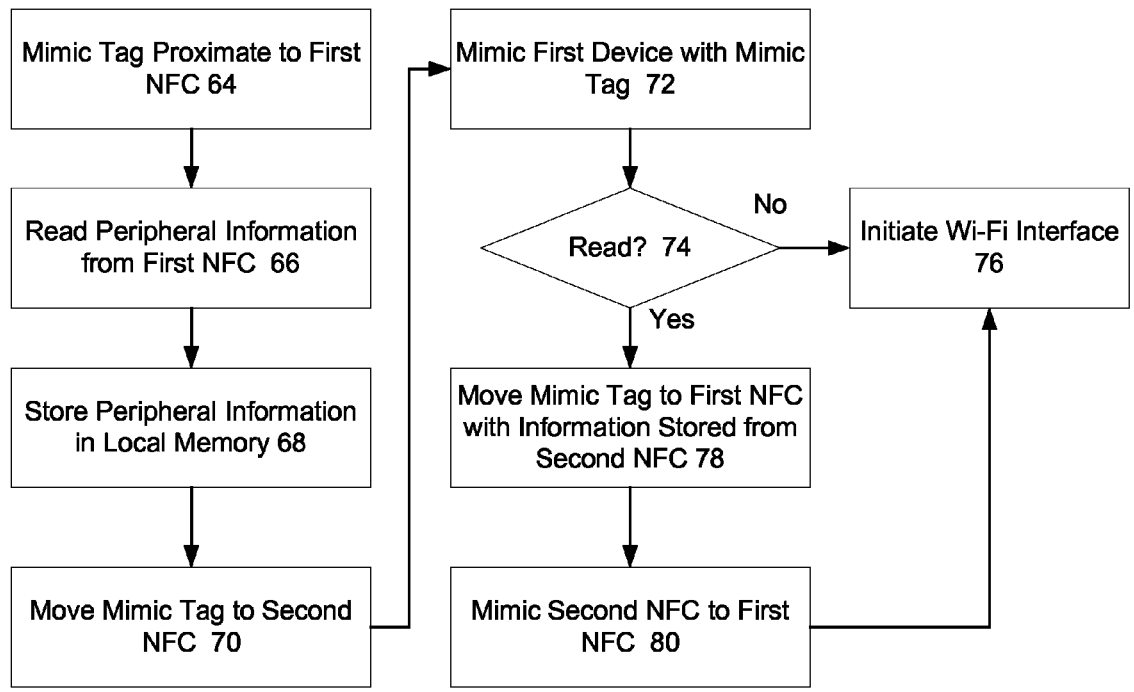
FIG. 5 depicts a flow diagram of a process for establishing a wireless interface between an information handling system and a peripheral with a NFC mimic device.

Referring now to FIG. 5, a flow diagram depicts a process for establishing a wireless interface between an information handling system and a peripheral with a NFC mimic device. The process begins at step 64 by bringing a NFC mimic tag device in proximity with a NFC device of the peripheral. At step 66, peripheral configuration information is read from the peripheral NFC device to the NFC mimic tag. At step 68, the peripheral configuration information is stored to local memory of the NFC mimic tag. At step 70, the NFC mimic tag is moved proximate to an information handling system NFC device. At step 72, the NFC mimic tag mimics the peripheral NFC device by transmitting the stored peripheral configuration information to the information handling system. Although described in terms of a NFC tag that uses NFC Forum standards, in alternative embodiments the NFC mimic tag can be any near field communication device, powered or unpowered, such as RFID tags or similar devices.

At step 74 a determination is made of whether the information handling system should send information to the peripheral with a NFC communication. If not, the process continues to step 76 to apply the peripheral configuration information, such as by setting up a Wi-Fi interface. If yes, the process continues to step 78 where the NFC mimic tag reads and stores information provided from the NFC device of the information handling system. At step 80, the NFC mimic tag is moved to the peripheral so that information provided from the information handling system is transmitted from the NFC mimic tag to the peripheral. For example, security information provided from the information handling system to the NFC mimic tag is copied to the peripheral to establish a secure wireless interface at step 76.

Figure 6:
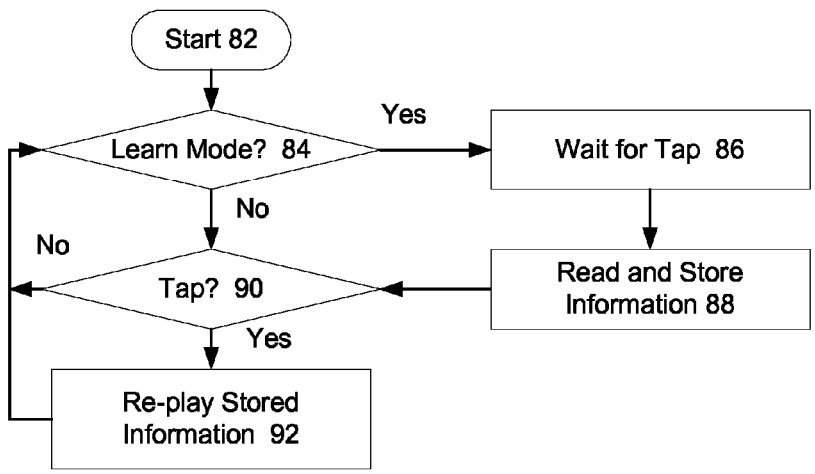
FIG. 6 depicts a flow diagram of logic within a mimic device for mimicking an external NFC device.

Referring now to FIG. 6, a flow diagram depicts logic within a NFC mimic device for mimicking an external NFC device. The process starts at step 82 and continues to step 84 to determine if the NFC mimic device is in a learn mode. If yes, the process continues to step 86 to wait for a tap or other acceleration indicating that information received at the mimic device should be stored into local memory. At step 88, incoming NFC data is read and stored. At step 90, a determination is made of whether a tap is detected. If not, the process returns to step 84. If so, the process continues to step 92 to re-play the NFC information stored at step 88. In alternative embodiments, alternative indicators may be used to indicate to the mimic device that a detected NFC transmission should be stored or that a stored NFC transmission should be repeated from storage.

Although the present invention has been described in detail, it should be understood that various changes, substitutions and alterations can be made hereto without departing from the spirit and scope of the invention as defined by the appended claims.

What is claimed is:

1. An information handling system comprising:
    a housing;
    a processor disposed in the housing and operable to process information;
    memory disposed in the housing and interfaced with the processor to store information;
    a wireless device disposed in the housing operable to communicate wirelessly with a peripheral using configuration information;
    an NFC device disposed in the housing and having memory, the memory storing configuration information, the NFC device operable to obtain peripheral configuration information from the peripheral and provide the peripheral configuration information to the wireless device to support wireless communication with the peripheral; and
    a mimic device separate from the housing and the peripheral, the mimic device operable to read the peripheral configuration information from the peripheral with a first NFC antenna, to communicate the peripheral information through a cable coupled with the first NFC antenna and coupled with a second NFC antenna, and to communicate with the NFC device by mimicking the peripheral using communications from the second NFC antenna to the NFC device.

2. The information handling system of claim 1 further comprising:
    a peripheral separate from the housing, the peripheral having a wireless device to communicate wirelessly using configuration information and a peripheral NFC device having memory, the memory storing the peripheral communication information;
    wherein the mimic device is further operable to read configuration from the NFC device of the housing, to store the configuration information in local memory and to communicate the configuration information to the peripheral device to support wireless communication with the wireless device.

3. The information handling system of claim 2 wherein the mimic device comprises an NFC tag having programmable local memory.

4. The information handling system of claim 2 wherein the mimic device comprises an NFC device having local power and programmable local memory.

5. The information handling system of claim 1 wherein the mimic device comprises a memory, battery and processor proximate the first NFC antenna to store the peripheral configuration information and respond to requests for the peripheral configuration information.

6. The information handling system of claim 5 wherein the processor is interfaced with the first and second NFC antenna to manage communications at each of the first and second NFC antenna.

7. The information handling system of claim 1 wherein the mimic device comprises:
    local memory operable to store information; and
    a processor interfaced with the first NFC antenna and the local memory, the processor operable to detect information received at the first NFC antenna, to store the information in the local memory, to detect a request for the information at the second NFC antenna and, in response to detecting the request, to transmit the information from the second NFC antenna.

8. The information handling system of claim 7 wherein the information detected at the NFC device comprises peripheral configuration information and the request comprises a request from the NFC device in the housing for the peripheral information.

9. The information handling system of claim 8 wherein the processor detects information received at the NFC device in response to a transmission issued by the first NFC device that mimics the NFC device in the housing.

10. A method for configuring an information handling system to communicate with a peripheral, the method comprising:
    bringing a mimic device into proximity with an NFC of the peripheral;
    reading peripheral configuration information from the NFC of the peripheral to a first NFC antenna of the mimic device;
    sending the peripheral communication information from the first NFC antenna to a second NFC antenna through a cable coupled with the first and second antenna; and
    mimicking the peripheral with the mimic device by transmitting the peripheral information from the second NFC antenna to an information handling system NFC, the mimicking providing the peripheral information from the mimic device to the information handling system NFC as if the mimic device is the peripheral.

11. The method of claim 10 further comprising:
    reading information with the mimic device second NFC antenna from the information handling system NFC;
    storing the information read from the information handling system at the mimic device; and
    mimicking the information handling system with the mimic device by transmitting the information handling system information from the mimic device to the peripheral.

12. The method of claim 11 wherein the peripheral applies the information handling system information to establish a secure wireless network interface with the information handling system.

13. The method of claim 10 wherein the information handling system applies the peripheral configuration information to establish a wireless network interface with the peripheral device.

14. The method of claim 10 wherein the mimic device comprises a NFC tag having a mimic initiator that initiates storing the peripheral information only in response to one or more predetermined conditions.

15. The method of claim 14 wherein the one or more predetermined conditions comprise an acceleration detected at the mimic device.

16. The method of claim 14 wherein the one or more predetermined conditions comprise pressing an initiator button on the mimic device.

17. A NFC mimic device comprising:
    first and second housings;
    a first NFC antenna disposed in the first housing;

a second NFC device disposed in the second housing;
a cable interfacing the first and second NFC antenna;
memory interfaced with the first NFC antenna;
a processor operable to store information received at the first NFC antenna from an electronic device having a NFC device, the electronic device located distal the second housing, and to provide the information through the cable to the second NFC antenna disposed in the second housing to mimic the electronic device by emulating an NFC communication of the electronic device.

18. The NFC mimic device of claim 17 further comprising a reprogrammable NFC tag having an acceleration detector, the processor storing information in response to an acceleration detected by the acceleration detector.

\* \* \* \* \*